(12) United States Patent
Kayahara

(10) Patent No.: US 11,970,016 B2
(45) Date of Patent: Apr. 30, 2024

(54) PRINTING APPARATUS AND PRINTING METHOD

(71) Applicant: SEIKO EPSON CORPORATION, Tokyo (JP)

(72) Inventor: Naoki Kayahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 710 days.

(21) Appl. No.: 17/104,053

(22) Filed: Nov. 25, 2020

(65) Prior Publication Data
US 2021/0162775 A1 Jun. 3, 2021

(30) Foreign Application Priority Data

Nov. 28, 2019 (JP) ................. 2019-215700

(51) Int. Cl.
*B41J 2/045* (2006.01)
*B41J 3/407* (2006.01)
*B41J 11/00* (2006.01)

(52) U.S. Cl.
CPC ......... *B41J 3/4078* (2013.01); *B41J 2/04505* (2013.01); *B41J 11/0095* (2013.01)

(58) Field of Classification Search
CPC .. B41J 3/4078; B41J 2/04505; B41J 3/04505; B41J 11/0095
See application file for complete search history.

(56) References Cited

U.S. PATENT DOCUMENTS

| 6,499,822 | B1 | 12/2002 | Abe et al. |
| 6,712,444 | B2 | 3/2004 | Abe et al. |
| 6,792,865 | B2 | 9/2004 | Brunet-Manquat |
| 2003/0030686 | A1 | 2/2003 | Abe et al. |
| 2003/0110969 | A1 | 6/2003 | Brunet-Manquat |
| 2005/0011386 | A1 | 1/2005 | Brunet-Manquat |
| 2007/0070099 | A1* | 3/2007 | Beer ................... B41J 11/0035 347/8 |

FOREIGN PATENT DOCUMENTS

| CN | 107901622 A | 4/2018 |
| EP | 3 653 391 A1 | 5/2020 |
| JP | H11-300948 A | 11/1999 |
| JP | H11-300949 A | 11/1999 |
| JP | 2004-501000 A | 1/2004 |
| JP | 2005-041146 A | 2/2005 |
| JP | 2007-313717 A | 12/2007 |

* cited by examiner

*Primary Examiner* — Jason S Uhlenhake
(74) *Attorney, Agent, or Firm* — Global IP Counselors, LLP

(57) ABSTRACT

A printing apparatus includes a transport unit that transports clothing fabric at which a pattern is formed, an imaging unit that images the clothing fabric transported by the transport unit, a printing unit that performs printing on the clothing fabric transported by the transport unit, and a control unit, the control unit registers first image data representing the pattern in a predetermined storage unit, extracts, based on a comparison between the first image data and second image data, a pattern region corresponding to the pattern in the second image data, the second image data is generated by imaging of the clothing fabric by imaging unit, corrects third image data representing an image to be printed overlaid on the pattern to match the shape of the pattern region, and causes the printing unit to perform the printing of the corrected third image data on the clothing fabric.

5 Claims, 5 Drawing Sheets

PRINTING APPARATUS AND PRINTING METHOD

The present application is based on, and claims priority from JP Application Serial Number 2019-215700, filed Nov. 28, 2019, the disclosure of which is hereby incorporated by reference herein in its entirety.

BACKGROUND

1. Technical Field

The present disclosure relates to a printing apparatus and a printing method for performing printing on a clothing fabric.

2. Related Art

An image forming device is disclosed that uses a recording medium having tile-shaped dividing line formed at the surface, determines the distortion of the transported recording medium by detecting the dividing line by a sensor, executes a correction processing on image data according to the result of the determination, and performs image formation according to the corrected image data. (see JP-A-11-300949).

When a jacquard woven clothing fabric and clothing fabric in which a three-dimensional pattern is formed by devising a weaving method of a yarn, such as a lace clothing fabric are used in a printing medium, it is a great labor to form a dividing line on a medium as disclosed in JP-A-11-300949. Also, forming a dividing line may possibly deteriorate the quality and texture of the clothing fabric. In addition, it is possible that the dividing line cannot be accurately formed due to the unevenness of the pattern on the clothing fabric, and the distortion of the clothing fabric cannot be accurately detected.

Therefore, when the clothing fabric at which the pattern is formed may have stretching or distortion, there has been a demand for a tweak for performing accurate printing corresponding to the pattern.

SUMMARY

A printing apparatus includes a transport unit that transports clothing fabric at which a pattern is formed, an imaging unit configured to image the clothing fabric transported by the transport unit, a printing unit configured to perform printing on the clothing fabric transported by the transport unit, and a control unit, the control unit registers first image data representing the pattern in a predetermined storage unit, extracts, based on a comparison between the first image data and second image data generated by imaging of the clothing fabric by imaging unit, a pattern region corresponding to the pattern in second image data, corrects third image data representing an image to be printed overlapping the pattern so that the third image matches a shape of the pattern region, and causes the printing unit to perform the printing of the corrected third image data on the clothing fabric.

DESCRIPTION OF EXEMPLARY EMBODIMENTS

Embodiments of the present disclosure will be described below with reference to the diagrams. Note that each of the diagrams is merely illustrative for describing the present embodiment. Since the drawings are illustrations, the ratio and the shape may be inaccurate, and maybe not match each other, sometimes may be partially omitted.

1. Device Configuration

Figure 1:
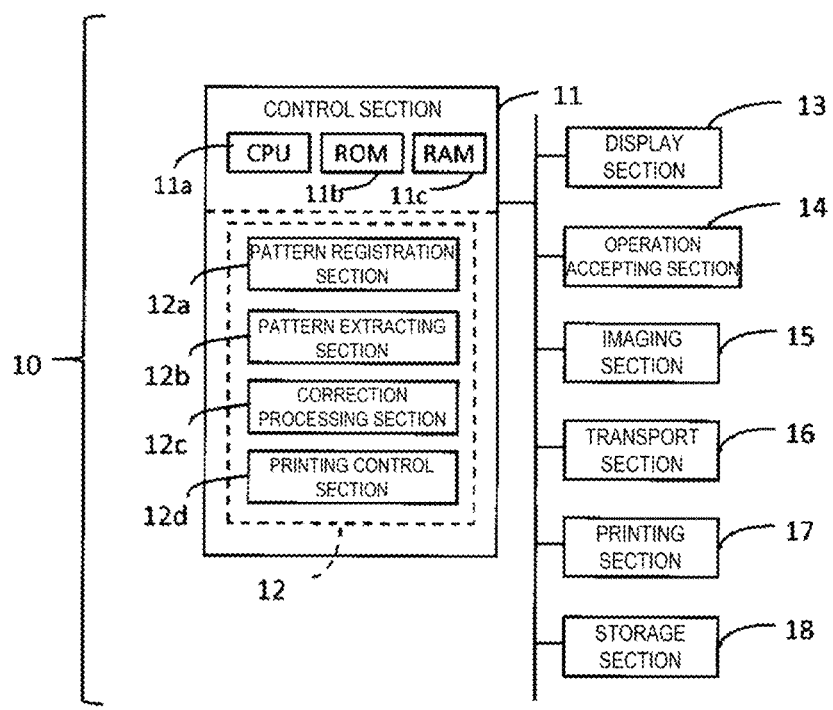
FIG. 1 is a block diagram simply illustrating a configuration of a printing apparatus.

FIG. 1 simply illustrates a configuration of a printing apparatus 10 according to the present embodiment.

The printing apparatus 10 executes a printing method. The printing apparatus 10 includes a control unit 11, a display unit 13, an operation accepting unit 14, an imaging unit 15, a transport unit 16, a printing unit 17, a storage unit 18, and the like. The control unit 11 is configured to include one or more ICs having CPU 11a as a processor, ROM 11b, and RAM 11c, and the like, and other non-volatile memory, and the like.

In the control unit 11, the processor or, in other words, the CPU 11a controls the printing apparatus 10 by executing calculation processing according to one program 12 or more stored in the ROM 11b, and other memories, or the like, using the RAM 11c or the like as a work area. The control unit 11 functions as a pattern registration unit 12a, a pattern extracting unit 12b, a correction processing unit 12c, the printing control unit 12d, and the like by following the program 12. Note that the processor is not limited to a single CPU, and may be a configuration in which processing is executed by a hardware circuit such as a plurality of CPUs, an ASIC, or the like, or a configuration in which the CPU and the hardware circuit cooperate to execute processing.

The display unit 13 is a unit configured to display visual information, and is configured by, for example, a liquid crystal display, an organic electroluminescence display, or the like. The display unit 13 may be configured to include a display and a drive circuit configured to drive the display. The operation accepting unit 14 is a unit configured to accept the operation by user, and is realized by, for example, a physical button, a touch panel, a mouse, a keyboard, or the like. Of course, the touch panel may be realized as a function of the display unit 13. The display unit 13 and the operation accepting unit 14 may be part of the configuration of the printing apparatus 10, but may be a peripheral device external to the printing apparatus 10.

The transport unit 16 is a mechanism configured to transport a printing medium under control by the control unit 11. In the present embodiment, the printing medium is a clothing fabric formed in such a manner that one or a set of patterns are repeatedly arranged, such as the above-mentioned jacquard woven clothing fabric. In the following, one or a set of such patterns is treated as one pattern.

The transport unit 16 has a configuration such as a delivery roller delivering the clothing fabric before printing wound into a roll to the downstream of the transport, a belt or a roller configured to further transport the delivered clothing fabric, a windup roller configured to wind and take back the printed clothing fabric in a roll shape again, a motor configured to cause each roller or belt to rotate, or the like. In the following, the upstream and downstream of the transport direction by the transport unit 16 are described simply as upstream and downstream.

The imaging unit 15 images the clothing fabric transported by the transport unit 16 under control by the control unit 11. The imaging unit 15 has a configuration such as a light source that irradiates the clothing fabric, an imaging element configured to receive reflected light from the clothing fabric, and generate and output image data as an imaging result.

The printing unit 17 executes printing on the clothing fabric transported by the transport unit 16 under the control of the control unit 11. The printing unit 17 is disposed downstream of the imaging unit 15. The printing unit 17 performs printing on the clothing fabric based on the printing data transmitted from the control unit 11. The printing unit 17 can execute printing by discharging ink having a plurality of colors such as cyan (C), magenta (M), yellow (Y), black (K), and the like, by an ink-jet method. According to the ink-jet method, the printing unit 17 executes the printing to the clothing by discharging ink dots from nozzle (not illustrated) based on the printing data in which a dot on or a dot off is defined for each pixel.

The storage unit 18 is a storage unit such as a non-volatile memory, a hard disk drive, and the like. The storage unit 18 may be understood as a part of the control unit 11. Additionally, the RAM 11c may be understood as a part of the storage unit 18.

The printing apparatus 10 may be referred to as a recording apparatus, an image forming apparatus, a printer, or the like. The printing apparatus 10 may be not only realized by a single independent apparatus, but also may be realized by a plurality of apparatuses communicatively connected to each other via a communication interface or a network. The printing apparatus 10 configured by a plurality of apparatuses may be referred to as a printing system 10.

The printing system 10 is configured to include, for example, one information processing apparatus or more functioned as the control unit 11, and a printer including the imaging unit 15, the transport unit 16, and the printing unit 17. The information processing apparatus is, for example, a personal computer (PC), a server, a smart-phone, a tablet terminal, or a apparatus having the same degree of processing capability as above. In the printing system 10, an apparatus that serves the control unit 11 may be referred to as an image processing apparatus, a printing control apparatus, or the like. Of course, some of the apparatuses constituting the printing system 10 may be regarded as a disclosure.

Figure 2A:
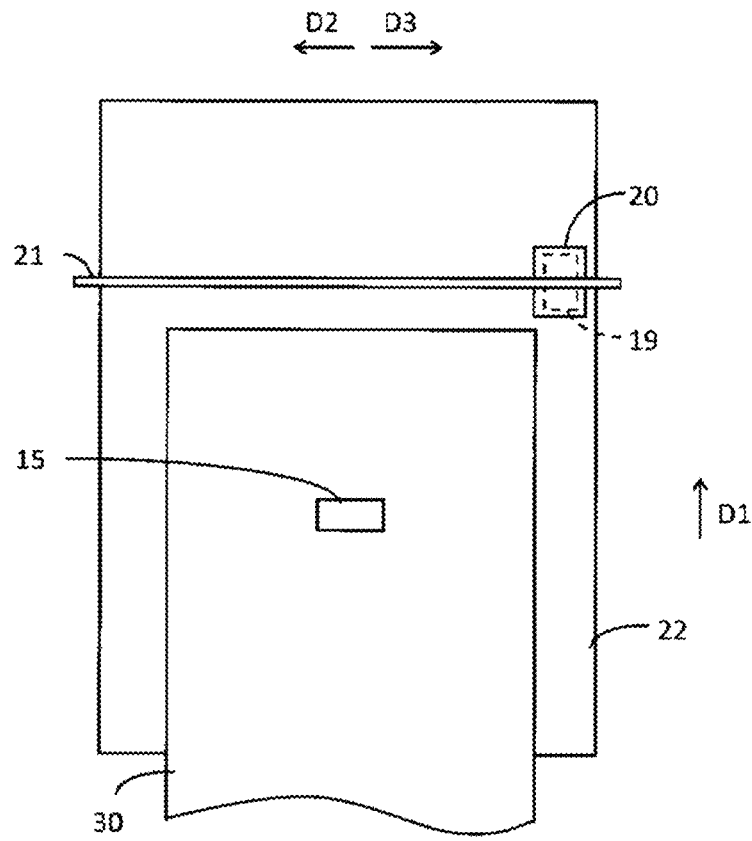
FIG. 2A is a diagram illustrating a configuration of a clothing fabric to be transported and a configuration of the vicinity of the clothing fabric in a perspective facing downward from above.

FIG. 2A illustrates a configuration of a clothing fabric 30 to be transported and a configuration of vicinity of clothing fabric 30 in a perspective facing downward from above. In FIG. 2A, the depiction of the patterns formed in advance on the clothing fabric 30 is omitted. In FIG. 2A, the transport direction of the clothing fabric 30 by the transport unit 16 is indicated by sign D1. Sign 22 denotes an endless belt 22 as a part of the transport unit 16. The clothing fabric 30 placed on the endless belt 22 is transported downstream from upstream in the transport direction D1 by the rotation of the endless belt 22.

As illustrated in FIG. 2A, a carriage 20 is disposed above the endless belt 22. The carriage 20 is movable in directions D2 and D3 that are intersect the transport direction D1. The interunit mentioned here is orthogonal, but the interunit can be understood not only as strictly orthogonal but also as an error occurring in the manufacture of the product. The carriage 20 moves along the elongated guide part 21 in the directions D2 and D3 that are intersect the transport direction D1. The directions D2 and D3 are opposite to each other, and one of the directions D2 and D3 can be interpreted as a forward movement direction of the carriage 20 and the other can be interpreted as a backward movement direction of the carriage 20.

The carriage 20 includes a print head 19. In other words, the print head 19 moves with the carriage 20 in the direction D2 and the direction D3. The directions D2 and D3 are referred to as the "main scanning direction" and are referred to as the "width direction". The carriage 20 and the print head 19 as described above constitute the printing unit 17. Although not illustrated, the printing head 19 opens a plurality of nozzles on the lower surface opposite the endless belt 22. The print head 19 discharges ink from the nozzles based on the printing data while moving with the carriage 20 in the direction D2 and the direction D3.

As illustrated in FIG. 2A, the imaging unit 15 is disposed above the endless belt 22 at a predetermined position upstream of the carriage 20 and the print head 19.

Figure 2B:
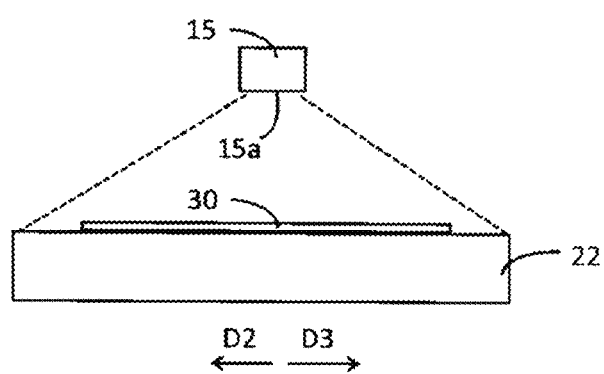
FIG. 2B is a diagram illustrating a portion of the configuration illustrated in FIG. 2A in a perspective from the upstream side to the downstream side.

FIG. 2B illustrates a portion of the configuration illustrated in FIG. 2A with a point of view from upstream to downstream. The imaging unit 15 has a lower surface opposite the endless belt 22 as an imaging surface 15a, and images the clothing fabric 30 on the endless belt 22 via the imaging surface 15a. The imaging unit 15 is, for example, a linescan type camera in which a plurality of imaging elements are arranged along the width directions D2 and D3 within the camera. The imaging unit 15 repeats the imaging of the line unit via a lens and an imaging element (not illustrated) provided on the imaging surface 15a. In FIG. 2B, the imaging range of the imaging unit (imaging unit) 15 in the width directions D2 and D3 is illustrated by a dashed line. The imaging unit 15 is capable of imaging approximately the entire range of the endless belt 22 in the width directions D2 and D3 due to the function of the lens.

The configuration of the imaging unit 15 is not limited to the examples of FIG. 2A and FIG. 2B. For example, a configuration may be adopted in which the plurality of imaging units 15 are arranged along the width directions D2 and D3 above the endless belt 22, and each of the plurality of imaging units 15 respectively share a part of the whole range of the endless belt 22 in the width directions D2 and D3 to execute imaging. Alternatively, the imaging unit 15 may be a line sensor configured to arrange a plurality of imaging elements over approximately the entire range of the endless belts 22 in the width directions D2 and D3. Alternatively, the imaging unit 15 may be mounted on a carriage that is movable along the width directions D2 and D3, as well as that in which the print head 19 is mounted on the carriage 20, and may be configured to image an image on the endless belt 22 while moving in the width directions D2 and D3 by the carriage.

2. Printing Method

Figure 3:
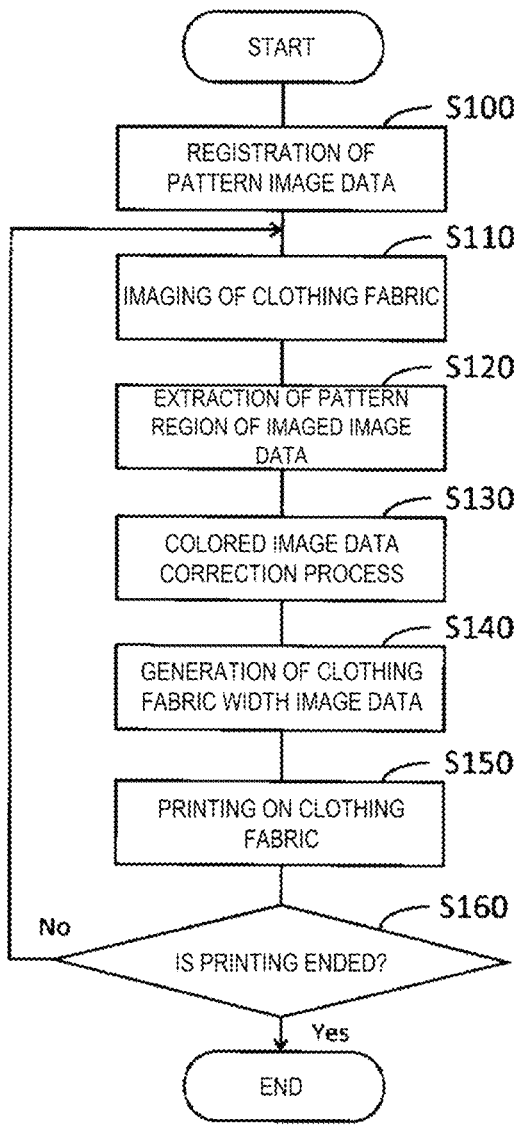
FIG. 3 is a flowchart illustrating a printing processing.

FIG. 3 is the printing processing in which the control unit 11 executes according to the program 12 illustrated by a flowchart.

In step S100, the pattern registration unit 12a of the control unit 11 registers the pattern image data representing the pattern formed at the clothing fabric 30 into the storage unit 18. The pattern image data corresponds to the "first image data", and step S100 corresponds to the registration step.

Figure 4:
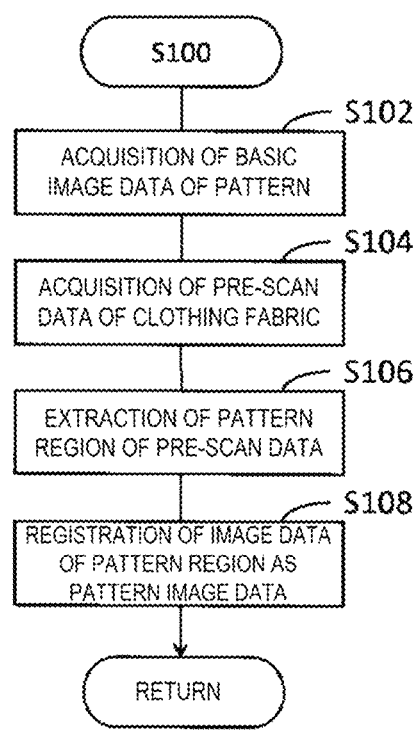
FIG. 4 is a flowchart illustrating details of step S100.

FIG. 4 illustrates the details of step S100 by a flowchart.

First, in step S102, the pattern registration unit 12a acquires basic image data representing the pattern of the clothing fabric 30. The clothing fabric 30 may be, for example, a textile of a repeating weave pattern designed by a designer. Therefore, it is assumed that the basic image data is image data representing the pattern that has been generated in advance using predetermined software for design or drawing. For example from a PC external to the printing apparatus 10 the pattern registration unit 12a inputs basic image data stored in the PC according to the user operation, and stores the inputted base image data in the storage unit 18.

In step S104, the pattern registration unit 12a acquires pre-scan data, which is the image data generated by the pre-scan of the clothing fabric 30. Pre-scan means a reading or imaging that is executed prior to imaging of the clothing fabric 30 according to step S110 described below. For example, a user may scan the clothing fabric 30 on a scanner external to the printing apparatus 10 in advance. Then, the pattern registration unit 12a inputs the image data generated by this scan from the scanner and stores the image data as pre-scan data in the storage unit 18.

Alternatively, the pre-scan may be executed by the imaging unit 15. For example, the control unit 11 starts the transport of the clothing fabric 30 in the transport unit 16, and stops the transport of the clothing fabric 30 at a timing at which the head of the clothing fabric 30 has been reached to a position downstream from the imaging unit 15 by a predetermined distance. The head of the clothing fabric 30 is the end facing downstream of the clothing fabric 30. The imaging unit 15 images the clothing fabric 30 passing under the imaging unit 15 by transport, and the pattern registration unit 12a inputs image data generated by the imaging from the imaging unit 15 and stores the image data as pre-scan data in the storage unit 18.

In step S106, the pattern registration unit 12a compares the base image data acquired in step S102 with the pre-scan data acquired in step S104, and extracts a pattern region corresponding to one pattern of the clothing fabric 30 from the pre-scan data. At this time, the pattern registration unit 12a uses the image recognition technology to extract image regions with higher similarity with the basic image data in the pre-scan data, and makes the image region as the pattern region.

Then, in step S108, the pattern registration unit 12a stores image data corresponding to the pattern region extracted in step S106 as pattern image data in the storage unit 18. As described above, the registration of the pattern image data is ended.

According to the description of FIG. 4, the pattern image data can be said to be at least a portion of the pre-scan data.

However, the pattern registration unit 12a may simplify the step S100 by registering the basic image data itself with the storage unit 18 as pattern image data.

Return to the description of FIG. 3.

In step S110, the control unit 11 causes the imaging unit 15 to image the clothing fabric 30. Step S110 corresponds to an imaging step. The region of the clothing fabric 30 that is imaged in one step S110 is referred to as the "target region". For example, the length in the width directions D2 and D3 of the target region is the length in the width directions D2 and D3 of the clothing fabric 30, and the length in the transport direction D1 of the target region is a length including a predetermined number of the size of the pattern image data in the transport direction D1.

The control unit 11 controls the transport unit 16, and clothing fabric 30 is transported such that the area of the target region of clothing fabric 30 passes below the imaging unit 15. Then, the imaging unit 15 generates the imaged image data as an image result of a single target region by imaging the transported clothing fabric. The imaged image data corresponds to the "second image data".

Although not specifically illustrated in the flowchart of FIG. 3, the control unit 11 executes the transport unit 16 to continuously or intermittently transport the clothing fabric 30 for imaging of the clothing fabric 30 and printing on the clothing fabric 30 at least during the periods of step S110 to S160. Accordingly, the printing method of the present embodiment includes a transport step for transporting the clothing fabric 30.

In step S120, the pattern extracting unit 12b extracts the pattern region corresponding to the pattern of the clothing fabric 30 in the imaged image data based on the contrast between the pattern image data registered in step S100 with the imaged image data generated by the imaging of step S110. Step S120 corresponds to an extraction step. In the imaged image data, which is the imaging result of the target region of the clothing fabric 30, a plurality of patterns are represented side by side. Therefore, the pattern extracting unit 12b extracts the pattern region for each pattern that is represented side by side in the imaged image data.

The pattern extracting unit 12b may extract an image region having a degree of similarity with the pattern image data that is greater than a predetermined level as the pattern region in the imaged image data using image recognition techniques. Specifically, the pattern extracting unit 12b extracts the edge of the image in the pattern image data, and similarly extracts the edge of the image in the imaged image data. Then, the distribution of edges in the pattern image data is repeatedly compared while shifting the position with respect to the distribution of the edges in the imaged image data, and while deforming the pattern image data, a region in which a degree of matching between the distribution of edges is a high evaluation not less than a predetermined value is extracted as one pattern region. With the processing described above, the pattern extracting portion 12b extracts a plurality of pattern regions from the imaged image data.

Extracting a plurality of pattern regions from the imaged image data represented in the two-dimensional coordinate is also to identify the coordinates of the corners of each pattern region in the imaged image data.

As with the processing of step S120, in step S106 described above, the pattern registration unit 12a can extract the pattern regions in the pre-scan data according to the degree of matching of the distribution of edges between the contrasting images.

In step S130, the correction processing unit 12c corrects the colored image data representing the image to be printed overlaid on the pattern of the fabric 30 in a way of matching the shape of the pattern region extracted in step S120. The colored image data corresponds to "third image data" and step S130 corresponds to a correction step. The colored image data is pre-generated colored image data representing a color or color print range to be colored in one pattern. The colored image data is stored in advance in the storage unit 18, for example. Alternatively, for example, from a PC external to the printing apparatus 10, the control unit 11 inputs colored image data stored in the PC according to the user operation, and stores the inputted colored image data in the storage unit 18.

The shape of the colored image data is an ideal shape of a region including one pattern, for example a rectangle. On the other hand, the shape of each pattern region extracted from the imaged image data in step S120 may be accompanied by stretching or distortion due to the stretching and distortion of the clothing fabric 30 to be transported, and there is no necessary to coincide with the shape of the colored image data. Thus, the correction processing unit 12c deforms the shape of the colored image data according to the individual shapes of the pattern regions extracted in step S120. Examples of the deformation method include affine transformation including magnification, minification, rotation, shearing, and the like of an image, and other methods of deformation. Such deformation is a correction by step S130.

In step S140, the printing control unit 12d generates clothing fabric width image data by arranging the plurality of colored image data corrected as described above according to the shape of each of the pattern regions in the imaged image data in correspondence with the arrangement of the plurality of pattern regions in the imaged image data. The clothing fabric width image data is image data obtained by combining a plurality of the corrected colored image data, and can be understood as an image to be printed at the target region that is a target of imaging in step S110.

In step S150, the printing control unit 12d performs printing the clothing fabric width image data generated in step S140 on the clothing fabric 30. Step S150 corresponds to a printing step for printing the corrected third image data. The printing control unit 12d converts the clothing fabric width image data by executing necessary processes such as a so-called color conversion process and a halftone process. Then, the printing control unit 12d transports the printing data to the printing unit 17, and causes the printing unit 17 to start printing by the movement of the carriage 20 and ink discharge from the print head 19 based on the printing data at a predetermined timing at which a target region set as the target of imaging in step S110 reached under the print head 19. As a result, the color image represented by the individual colored image data constituting the clothing fabric width image data is printed overlapping the pattern in a manner that matches the stretching and distortion of the individual patterns in the clothing fabric 30.

In the transport unit 16, it is provided with an encoder that detects the amount of rotation of rollers and belts rotating for transport. The control unit 11 calculates and grasps the transport distance of the current clothing fabric 30 according to the detection signal from the encoder. Accordingly, the control unit 11 can grasp the position of the target region in the transport direction D1, at the timing the target region reaches below the print head 19, the printing unit 17 can start the printing on the target region.

In step S160, the control unit 11 determines whether the printing is ended, when the printing is ended, determines "Yes" and terminates the flowchart of FIG. 3. The control unit 11 determines the printing is ended when, for example, the instruction of terminate the printing from the user is received, or if the printing is ended on the length of the clothing fabric 30 that was scheduled in the transport direction D1. Of course, even if it is determined to be "Yes" in step S160 and the flowchart of FIG. 3 is ended, the control unit 11 controls, for example, the necessary processing such as collecting the clothing fabric 30 by the windup roller, and then stops the transport unit 16.

On the other hand, when the printing does not end, the control unit 11 determines "No" in step S160 and repeats the processing after step S110. That is, the subsequent processing of step S110 is executed on the next target region adjacent to the upstream to the previous target region on the clothing fabric 30. Note that, in consideration of the imaging unit 15 being located upstream of the printing unit 17, the imaging unit 15 is capable of imaging a region upstream of the region of the currently printed clothing fabric 30 in parallel with printing by the printing unit 17. As a result, at a timing when printing on the target region is ended by step S150, imaging by the imaging unit 15 related to the next target region may be ended. Accordingly, at the timing that it is determined "No" in step S160, when the imaging by the imaging unit 15 of the next target region has been ended, the control unit 11 may execute the processing after step S120.

Alternatively, the control unit 11 may be configured to not simultaneously execute the imaging of the clothing fabric 30 by the imaging unit 15 and the printing of the clothing fabric 30 by the printing unit 17, and, if the control unit 11 determines "No" in step S160, the transport unit 16 is caused to feed the clothing fabric 30 backward, and an unprinted region of the clothing fabric 30 is returned to the upstream position of the imaging unit 15. The back feed is a transport in a downstream to upstream direction. Then, the control unit 11 may restart the processing after step S110 after the back feed of the clothing fabric 30.

Figure 5:
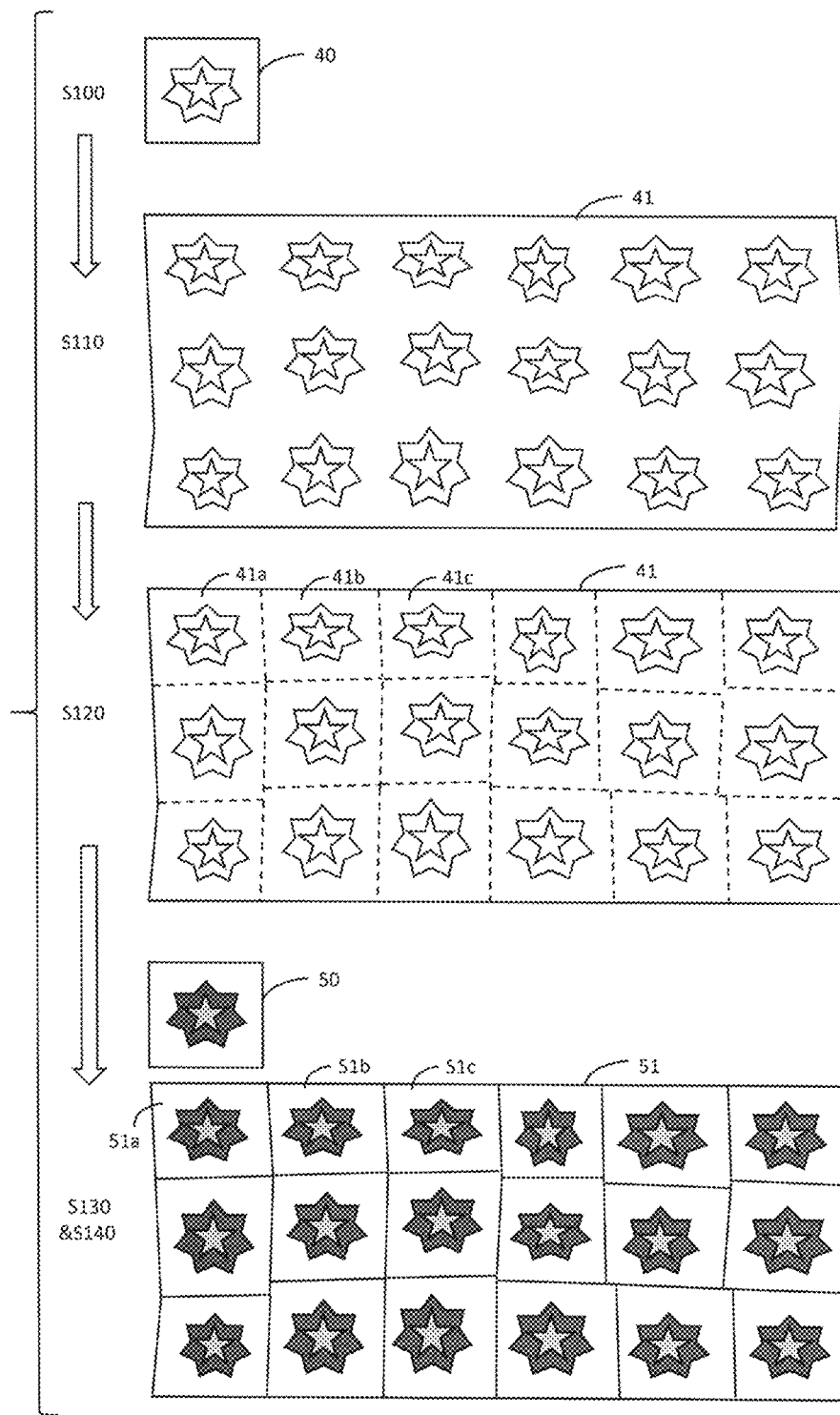
FIG. 5 is a diagram for explaining an embodiment with a specific example.

FIG. 5 is a diagram for explaining a portion of the flowchart of FIG. 3 according to a specific example. In step S100, the pattern registration unit 12a registers the pattern image data 40 into the storage unit 18. In the example of FIG. 5, the pattern image data 40 is image data representing a pattern designed with a petal shape as a motif.

In step S110, the target region of the clothing fabric 30 is imaged by the imaging unit 15, and as a result, the imaged image data 41 is obtained. If stretching or distortion occurs in the clothing fabric 30, each of the patterns represented in the imaged image data 41 also assumes a state of stretching or distortion.

In step S120, the pattern extracting unit 12b extracts the pattern region in the imaged image data 41 by comparing the pattern image data 40 with the imaged image data 41. In the example of FIG. 5, each of the regions separated by the dashed line in the imaged image data 41 is each pattern region in which the pattern extracting unit 12b has been extracted for each pattern. In FIG. 5, a pattern region which is a part of a plurality of pattern regions within the imaged image data 41 is indicated by sign 41a, 41b, 41c.

In step S130, the correction processing unit 12c corrects the colored image data 50 to match the shape of each pattern region of the imaged image data 41. In step S140, the printing control unit 12d generates clothing fabric width image data 51 by arranging the plurality of the corrected colored image data 50 corresponding to the arrangement of the pattern regions in the imaged image data 41.

According to the example of FIG. 5, sign 51a denotes the colored image data 50 corrected for matching the shape of the pattern region 41a. Similarly, the sign 51b denotes the colored image data 50 corrected for matching the shape of the pattern region 41b, and sign 51c is the colored image data 50 corrected for matching the shape of the pattern region 41c. The clothing fabric width image data image data 51 is image data in which such corrected colored image data 51a, 51b, 51c, . . . , is integrated as a sequence of the pattern regions 41a, 41b, 41c, . . . . The clothing fabric width image data 51 is printed on the target region of the clothing fabric 30 by step S150.

3. Summary

As described above, according to the present embodiment, the printing apparatus 10 includes a transport unit 16 configured to transport clothing fabric 30 at which a pattern is formed, an imaging unit 15 configured to image the clothing fabric 30 transported by the transport unit 16, a printing unit 17 configured to perform printing on the clothing fabric 30 transported by the transport unit 16, and a control unit 11. The control unit 11 registers first image data representing the pattern in a predetermined storage unit 18, extracts a pattern region corresponding to the pattern in second image data based on a comparison between the first image data and the second image data (imaged image data), the second image data is generated by imaging of the clothing fabric 30 by imaging unit 15, corrects third image data (colored image data) representing an image to be printed overlaid on the pattern, so as to match the shape of the pattern region, and causes the printing unit 17 to perform the printing of the corrected third image data on the clothing fabric 30.

According to the configuration, the printing apparatus 10 corrects the colored image data according to the shape of the pattern region extracted by comparing the registered pattern image data with the imaged image data, and prints the corrected colored image data on the clothing fabric 30. In this way the image represented by the colored image data is printed in the form that is according to the stretching or distortion of the pattern in the clothing fabric 30 and without being shifted from the pattern of the clothing fabric 30. In addition, high-quality printing processing for accurately printing an image to be printed overlaid on the pattern of the clothing fabric 30 as described above can be realized without requiring a dividing line in a conventional printing medium.

In addition, according to the present embodiment, the control unit 11 may register, as the first image data, image data (pre-scan data) generated by pre-scanning of the clothing fabric 30.

Rather than the basic image data prepared in advance as data representing the pattern of the clothing fabric 30 itself, the control unit 11 registers the pre-scan data obtained from the actual scanning of the cloth 30 as pattern image data, thus, the extraction of the pattern regions in step S120 can be performed more accurately.

In addition, according to the present embodiment, the control unit 11 extracts the pattern region based on a degree of matching between the distribution of edges in the first image data and the distribution of edges in the second image data.

According to the configuration, by using the edge as the feature value of the image, the pattern region can be extracted from the second image data with high accuracy.

In addition, according to the present embodiment, the imaging unit 15 may be a linescan type camera in which a plurality of imaging elements are arranged in directions D2 and D3 intersecting the transport direction D1 by the transport unit 16.

In addition, according to the above description, the present embodiment discloses a printing method includes a registration step for registering first image data representing a pattern formed at the clothing fabric 30 to a predetermined storage unit 18, a transport step for transporting the clothing fabric 30, am imaging step for imaging the transported clothing fabric 30, an extraction step for extracting a pattern region corresponding to the pattern in second image data based on a comparison between the first image data and the second image data, the second image data is generated by the imaging of the clothing fabric 30, a correction step for correcting third image data representing the image to be printed overlaid on the pattern, so as to match the shape of the pattern region, and a printing step for printing the corrected third image data on the transported clothing fabric 30.

The program 12 for causing a computer to execute the above-described method and the memory in which the program 12 is stored can be understood as the disclosure.

In the example of FIG. 2A, a configuration of a serial printer is disclosed in which the print head 19 is mounted on the carriage 20 and moves, the print head 19 may be a so-called line type head. That is, the print head 19 may be an elongated print head that is not mounted on the carriage 20 and that can cover the width of the clothing fabric 30 along the width directions D2 and D3.

In FIG. 2A and FIG. 2B, the configuration indicated by sign 22 is not an endless belt, but may be a platen as a platform that supports the clothing fabric 30 from below. That is, it may be understood that the clothing fabric 30 transported by a roller which is not illustrated moves over the platen.

What is claimed is:

1. A printing apparatus comprising:
   a transport unit configured to transport clothing fabric at which a pattern is formed;
   an imaging unit configured to image the clothing fabric transported by the transport unit;
   a printing unit configured to perform printing on the clothing fabric transported by the transport unit; and
   a control unit, wherein
   the control unit registers, in a predetermined storage unit, first image data representing the pattern,
   extracts, based on a comparison between the first image data and second image data generated by imaging of the clothing fabric by the imaging unit, a plurality of pattern regions in the second image data such that each of the plurality of pattern regions includes the pattern,
   corrects third image data that represent a region that has a rectangle shape and includes an image to be printed overlapping the pattern, such that the rectangle shape of the region of the third image data matches a shape of one of the plurality of pattern regions, the correcting being performed for each of the plurality of pattern regions to generate a plurality of pieces of corrected image data based on the third image data, and
   causes the printing unit to print the plurality of pieces of corrected image data on the clothing fabric.

2. The printing apparatus according to claim 1, wherein the control unit registers, as the first image data, image data generated by pre-scanning of the clothing fabric.

3. The printing apparatus according to claim 1, wherein the control unit extracts the plurality of pattern regions based on a degree of matching between a distribution of edges in the first image data and a distribution of edges of each pattern in the second image data.

4. The printing apparatus according to claim 1, wherein the imaging unit is a linescan type camera in which a plurality of imaging elements are arranged in a direction intersecting a transport direction by the transport unit.

5. A printing method comprising:
   registering, in a predetermined storage unit, first image data representing a pattern formed at clothing fabric;
   transporting the clothing fabric;
   imaging the transported clothing fabric;
   extracting, based on a comparison between the first image data and second image data generated by imaging of the clothing fabric, a plurality of pattern regions in the second image data such that each of the plurality of pattern regions includes the pattern;

correcting third image data that represent a region that has a rectangle shape and includes an image to be printed overlapping the pattern, such that the rectangle shape of the region of the third image data matches a shape of one of the plurality of pattern regions, the correcting being performed for each of the plurality of pattern regions to generate a plurality of pieces of corrected image data based on the third image data; and printing the plurality of pieces of corrected image data on the transported clothing fabric.

* * * * *